United States Patent
Choi et al.

(10) Patent No.: US 9,465,264 B2
(45) Date of Patent: Oct. 11, 2016

(54) ARRAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Seungjin Choi, Beijing (CN); Seongyeol Yoo, Beijing (CN); Youngsuk Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 183 days.

(21) Appl. No.: 14/362,241

(22) PCT Filed: Oct. 12, 2013

(86) PCT No.: PCT/CN2013/085103
§ 371 (c)(1),
(2) Date: Jun. 2, 2014

(87) PCT Pub. No.: WO2014/139283
PCT Pub. Date: Sep. 18, 2014

(65) Prior Publication Data
US 2016/0091765 A1 Mar. 31, 2016

(30) Foreign Application Priority Data

Mar. 14, 2013 (CN) .......................... 2013 1 0082081

(51) Int. Cl.
*H01L 21/77* (2006.01)
*H01L 21/027* (2006.01)
(Continued)

(52) U.S. Cl.
CPC ....... *G02F 1/134363* (2013.01); *G02F 1/1368* (2013.01); *G02F 1/13439* (2013.01); *G02F 1/133345* (2013.01); *H01L 21/77* (2013.01); *H01L 27/12* (2013.01); *H01L 27/124* (2013.01); *H01L 27/1218* (2013.01);
(Continued)

(58) Field of Classification Search
CPC . H01L 27/124; H01L 27/1288; H01L 33/36; H01L 33/382
See application file for complete search history.

(56) References Cited

U.S. PATENT DOCUMENTS 6,787,405 B2 * 9/2004 Chen ................... G02F 1/13454
438/154
7,924,386 B2 4/2011 Lee
(Continued)

FOREIGN PATENT DOCUMENTS

CN 1606125 A 4/2005
CN 101625491 A 1/2010
(Continued)

OTHER PUBLICATIONS

Chinese Office Action of Chinese Application No. 201310082081.X mailed Jan. 5, 2015 with English translation.
(Continued)

*Primary Examiner* — Raj R Gupta
(74) *Attorney, Agent, or Firm* — Collard & Roe, P.C.

(57) ABSTRACT

An array substrate and a manufacturing method thereof and a display device are provided, and the array substrate comprises: a substrate (1); a thin film transistor, a passivation layer (5) and a transparent electrode (6), sequentially formed on the substrate, wherein a groove (51) is formed in an upper surface of the passivation layer (5), and the transparent electrode (6) is provided in the groove (51).

7 Claims, 6 Drawing Sheets

(51) Int. Cl.
*H01L 27/12* (2006.01)
*G02F 1/1333* (2006.01)
*G02F 1/1343* (2006.01)
*G02F 1/1362* (2006.01)
*G02F 1/1368* (2006.01)
*H01L 29/423* (2006.01)
*H01L 29/49* (2006.01)
*H01L 29/786* (2006.01)
*G03F 7/00* (2006.01)

(52) U.S. Cl.
CPC ...... *H01L 27/1262* (2013.01); *H01L 27/1288* (2013.01); *H01L 29/42384* (2013.01); *H01L 29/4908* (2013.01); *H01L 29/7869* (2013.01); *H01L 29/78606* (2013.01); *H01L 29/78636* (2013.01); *G02F 2001/133357* (2013.01); *G03F 7/00* (2013.01)

(56) References Cited

U.S. PATENT DOCUMENTS

| | | | |
|---|---|---|---|
| 2002/0167009 A1 | 11/2002 | Kim | |
| 2005/0079657 A1 | 4/2005 | Yoo et al. | |
| 2008/0084364 A1* | 4/2008 | Bae | G09G 3/20 345/55 |
| 2010/0007836 A1* | 1/2010 | Lee | G02F 1/134363 349/139 |
| 2010/0009478 A1* | 1/2010 | Yang | G02F 1/134363 438/30 |
| 2014/0061645 A1 | 3/2014 | Li et al. | |

FOREIGN PATENT DOCUMENTS

| | | |
|---|---|---|
| CN | 102709241 A | 10/2012 |
| CN | 103151359 A | 6/2013 |
| KR | 10-2008-0038930 A | 5/2008 |
| KR | 10-20080038 A | 5/2008 |

OTHER PUBLICATIONS

Second Chinese Office Action of Chinese Application No. 201310082081.X mailed Apr. 17, 2015 with English translation.

International Search Report, International Preliminary Report on Patentability and Written Opinion of the International Searching Authority of PCT/CN2013/085103 in Chinese, mailed Jan. 23, 2014.

English translation of the International Preliminary Report on Patentability and Written Opinion of the International Searching Authority of PCT/CN2013/085103, issued Sep. 19, 2015.

Patent Certificate of Chinese Application No. 201310082081.X, issued Nov. 11, 2015.

English Translation of the International Search Report of PCT/CN2013/085103 published in English on Sep. 18, 2014.

European Office Action in European Application No. 13857663.2 dated Jul. 28, 2016.

* cited by examiner

S1, forming a thin film transistor and a passivation layer on the substrate, wherein the passivation layer covers the thin film transistor S2, forming a groove in an upper surface of the passivation layer S3, forming the transparent electrode in the groove forming the passivation layer on the substrate with the thin film transistor formed thereon

↓ coating a photoresist on the passivation layer, and exposing the photoresist through a double-tone mask, wherein the photoresist corresponding to a region where the transparent electrode is disposed is partly exposed, the photoresist corresponding to a region of a through hole exposing the drain electrode is completely exposed, and the photoresist in other regions is not exposed

↓ after a developing treatment, removing the completely exposed photoresist so that the passivation layer corresponding to the region of the through hole exposing the drain electrode is exposed, and then forming the through hole exposing the drain electrode by using an etching process

↓ removing the partly exposed photoresist by using an ashing process so that the passivation layer corresponding to the region of where the transparent electrode is disposed

↓ partly removing the exposed passivation layer by using an etching process, so that the groove is formed in an upper surface of the passivation layer

Fig. 5

ARRAY SUBSTRATE AND MANUFACTURING METHOD THEREOF, AND DISPLAY DEVICE

CROSS REFERENCE TO RELATED APPLICATIONS

This application is the National Stage of PCT/CN2013/085103filed on Oct. 12, 2013, which claims priority under 35 U.S.C. §119 of Chinese Application No. 201310082081. X filed on Mar. 14, 2013, the disclosure of which is incorporated by reference.

TECHNICAL FIELD

Embodiments of the present invention relate to an array substrate and a manufacturing method thereof, and a display device.

BACKGROUND

Recently, a TFT-LCD (Thin Film Transistor-Liquid Crystal Display) has played an important role in the field of display due to advantages such as excellent image quality, low energy consumption and being environmentally friendly. The TFT-LCD is formed by cell-assembling a color filter substrate and an array substrate, wherein, a current array substrate usually is formed through a plurality of mask processes.

FIG. 1 is a cross-sectional view of a structure of a current array substrate, as shown in FIG. 1, the array substrate comprises: a substrate 1; a gate electrode, a gate insulating layer 2 and a semiconductor layer which are provided on the substrate 1; a source electrode 3 and a drain electrode 4 provided on the insulating layer 2; a passivation layer 5 provided above and at the periphery of the source electrode 3 and the drain electrode 4; and a pixel electrode 6 provided on the passivation layer 5. The pixel electrode 6 is usually formed through a patterning process using a mask. During a manufacturing process of the TFT-LCD, the production cost of the mask is very high, and one further mask process will greatly affect production capacity and yield.

SUMMARY

Embodiments of the present invention provide an array substrate and a manufacturing method thereof and a display device, in which a transparent electrode is manufactured without using a mask, thus the number of the production process is reduced and the production cost is lowered.

On the one hand, the embodiments of the present invention provide an array substrate, comprising: a substrate; a thin film transistor, a passivation layer and a transparent electrode, sequentially formed on the substrate, wherein a groove is formed in an upper surface of the passivation layer, and the transparent electrode is provided in the groove.

Alternatively, the passivation layer is formed of photosensitive resin material.

Alternatively, a depth of the groove is 0.5 μm-3 μm.

Alternatively, the transparent electrode serves as a pixel electrode which is located in the groove.

Alternatively, the groove is formed in a comb shape, and the transparent electrode serves as a pixel electrode which is formed in a comb shape, and the array substrate further comprises a common electrode which is isolated from the pixel electrode by the passivation layer.

Alternatively, the groove is formed in a comb shape, and the transparent electrode serves as a common electrode which is formed in a comb shape, and the array substrate further comprises a pixel electrode which is isolated from the common electrode by the passivation layer.

On the other hand, the embodiments of the present invention further provide a manufacturing method of the array substrate, comprising: forming a thin film transistor and a passivation layer on a substrate, and the passivation layer covering the thin film transistor and being formed with a groove in a upper surface; and forming a transparent electrode in the groove.

Alternatively, the forming the thin film transistor on the substrate comprises: forming a gate electrode and a gate line on the substrate through a patterning process; forming a gate insulating layer on the gate electrode and the gate line; and forming an active layer and a source/drain electrode on the gate insulating layer through a patterning process.

Alternatively, the forming the groove in the upper surface of the passivation layer comprises: forming the passivation layer on the substrate with the thin film transistor formed thereon; coating a photoresist on the passivation layer, and exposing the photoresist through a double-tone mask, wherein the photoresist corresponding to a region where the transparent electrode is disposed is partly exposed, the photoresist corresponding to a region of a through hole exposing the drain electrode is completely exposed, and the photoresist in other regions is not exposed; after a developing treatment, removing the completely exposed photoresist so that the passivation layer corresponding to the region of the through hole exposing the drain electrode is exposed, and then forming the through hole exposing the drain electrode by using an etching process; removing the partly exposed photoresist by using an ashing process so that the passivation layer corresponding to the region of where the transparent electrode is disposed; and partly removing the exposed passivation layer by using an etching process, so that the groove is formed in an upper surface of the passivation layer.

Alternatively, the forming the groove in the upper surface of the passivation layer comprises: forming a photosensitive resin layer on the substrate with the thin film transistor formed thereon; exposing the photosensitive resin layer through a double-tone mask, so that the photosensitive resin layer corresponding to a region where the transparent electrode is disposed is partly exposed, the photosensitive resin layer corresponding to a region of the through hole exposing the drain electrode is completely exposed, and the photosensitive resin layer in other regions is not exposed; partly removing the photosensitive resin layer corresponding to the region where the transparent electrode is disposed to form the groove and completely removing the photosensitive resin layer corresponding to the region of the through hole exposing the drain electrode to form the through hole by using a developing process.

Alternatively, the forming the transparent electrode in the groove comprises: forming a transparent conductive layer on the substrate with the groove formed therein; coating a photoresist on the transparent conductive layer; performing an ashing treatment to the photoresist to retain the photoresist in the groove and remove the photoresist in regions other than the groove so as to expose the transparent conductive layer; and removing the exposed transparent conductive layer and stripping the photoresist in the groove using an etching process, thereby forming the transparent electrode.

Alternatively, the transparent electrode serves as a pixel electrode.

Alternatively, the groove is formed in a comb shape, and the transparent electrode serves as a pixel electrode, before forming the passivation layer, the method further comprises: forming a common electrode.

Alternatively, the groove is formed in a comb shape, and the transparent electrode serves as a common electrode, before forming the passivation layer, the method further comprises: forming a pixel electrode.

According to another aspect, the embodiments of the present invention further provide a display device comprising the above array substrate and a counter substrate opposite to the array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIGS. 2a-2e are cross-sectional views of a structure of an array substrate manufactured by various steps of a manufacturing method of the array substrate according to the embodiments of the present invention, wherein FIG. 2e is a cross-sectional view of a structure of the array substrate according to the embodiments of the present invention which is used in a vertical alignment type display device.

FIG. 5 and FIG. 6 are flow charts of the step of forming the groove in the upper surface of the passivation layer according to embodiments of the present invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A First Embodiment

The first embodiment of the present invention provides an array substrate, and the array substrate comprises: a substrate; a thin film transistor, a passivation layer and a transparent electrode, sequentially formed on the substrate, wherein a groove is formed in the upper surface of the passivation layer, and the transparent electrode is provided in the groove.

Figure 1:
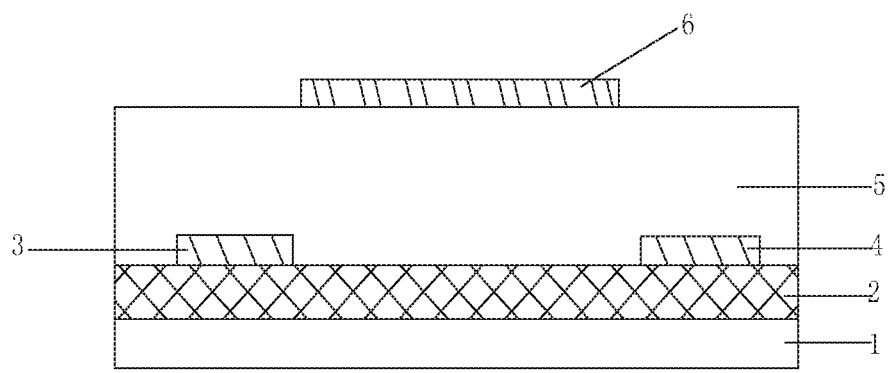
FIG. 1 is a cross-sectional view of a structure of an current array substrate.
Figure 2A:
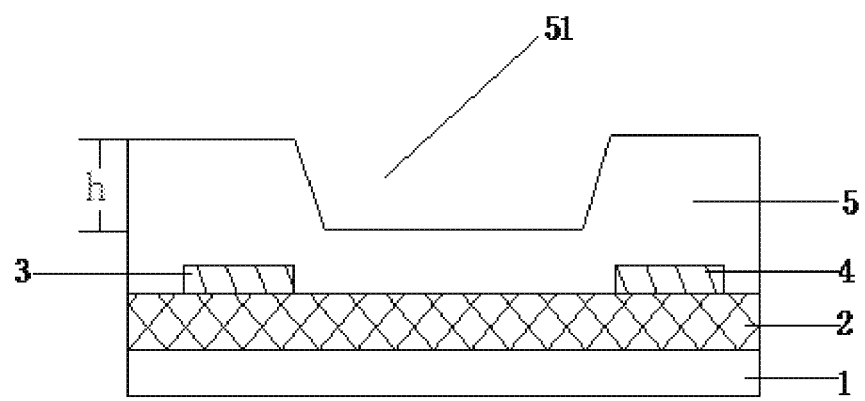
Figure 2B:
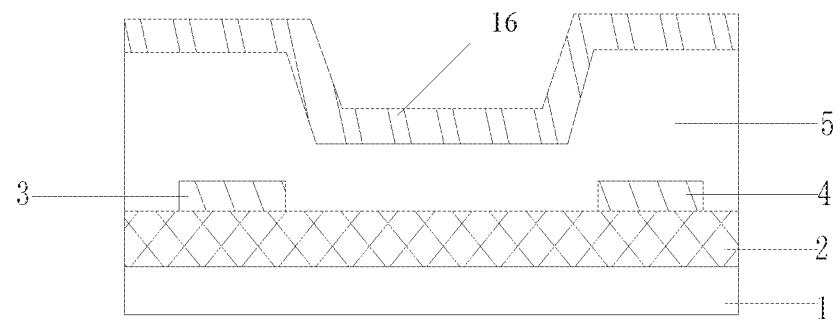
Figure 2C:
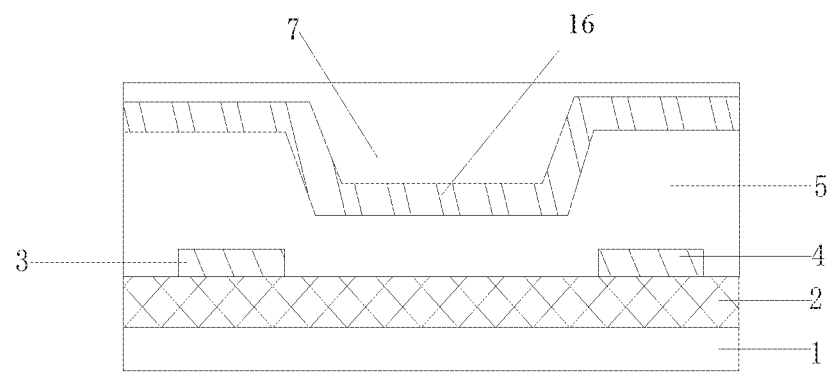
Figure 2D:
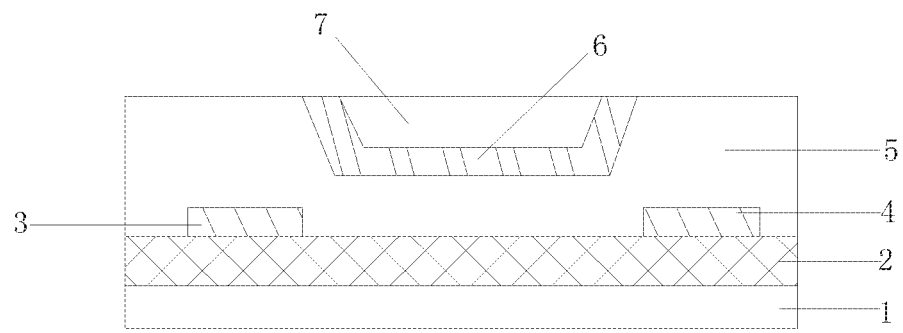
Figure 2E:
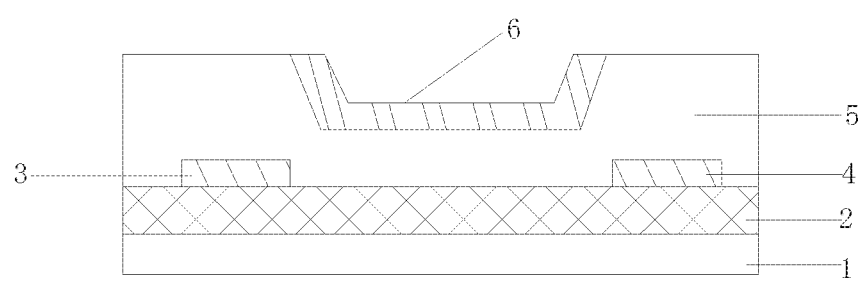

FIG. 2e is a cross-sectional view of a structure of the array substrate according to the embodiment of the present invention, as shown in FIG. 2e, the array substrate of the embodiment of the present invention comprises: a substrate 1 (a transparent substrate, for example, a glass substrate); a gate electrode and a gate line (not shown in the cross-sectional view), formed on the substrate 1; a gate insulating layer 2, formed on the gate electrode and the gate line; an active layer (not shown), formed on the gate insulating layer 2, which may be made of material such as oxide semiconductor or amorphous silicon a-Si; a source electrode 3 and a drain electrode 4, formed above the active layer; a passivation layer 5, formed on the source electrode 3 and the drain electrode 4, wherein a groove 51 is formed in an upper surface of the passivation layer 5, and a transparent electrode 6 is provided in the groove 51.

Exemplarily, a depth h of the groove 51 is 0.5 μm-3 μm (see FIG. 2a), wherein the depth of the groove refers to a distance from a bottom of the groove to the highest point of the passivation layer, that is, to the highest point at the upper surface of the passivation layer; alternatively, the depth of the groove 51 can be half of a thickness of the passivation layer 5.

Exemplarily, the transparent electrode can be made of material such as ITO (Indium Tin Oxide).

For a vertical alignment mode liquid crystal display device, the transparent electrode 6 can serve as a pixel electrode 6 which is provided in the groove 51, so that the pixel electrode 6 can be protected to the maximum extent under the precondition of saving space. For this type of liquid crystal display device, the common electrode is formed on a color filter substrate opposite to the array substrate.

Figures 3, 4:
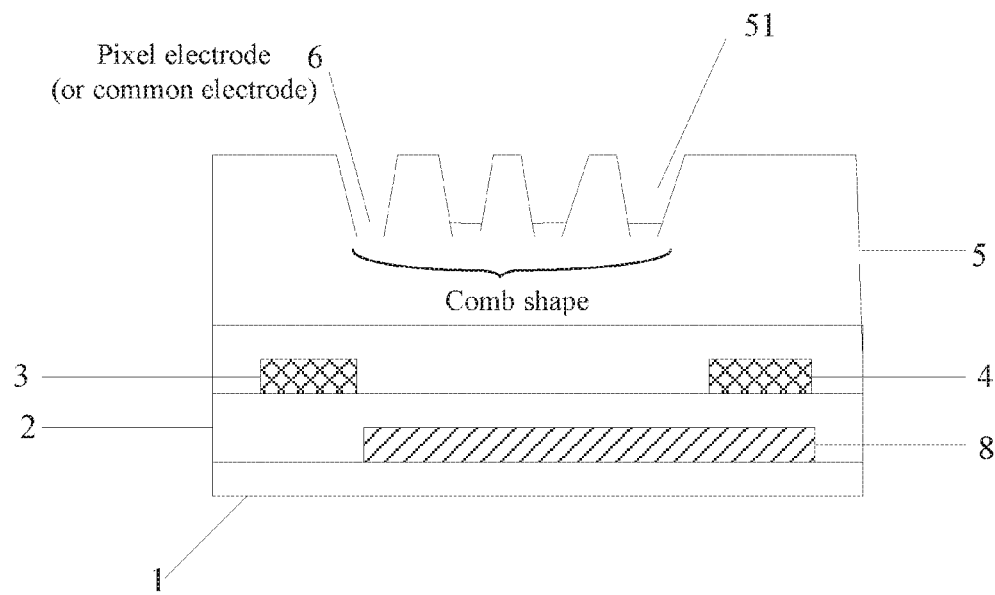
FIG. 3 is a cross-sectional view of a structure of the array substrate according to the embodiments of the present invention which is used in an FFS-mode display device.
FIG. 4 is a flow chart of a method of manufacturing an array substrate according to an embodiment of the present invention.

For an ADS (Advanced Super Dimension Switch) mode liquid crystal display device, a electric field generated by fringes of slit electrodes in the same plane and a electric field generated between the slit electrode layer and a plate electrode layer can constitute a multi-dimension electric field, so as to make liquid crystal molecules oriented in all directions between the slits electrodes and directly above the electrodes inside a liquid crystal cell capable of rotating, thus improving the operating efficiency of liquid crystals and increasing the light transmittance. FIG. 3 is a cross-sectional view of a structure of an array substrate which is used in the ADS mode display device according to an embodiment of the present invention, as shown in FIG. 3, the groove 51 is formed in a comb shape, the transparent electrode 6 serves as the pixel electrode 6 which is located in the comb shape groove, and the array substrate further comprises a common electrode 8 below the pixel electrode 6 via an insulating layer. Exemplarily, the common electrode 8 is formed to be a plate-shaped electrode.

Alternatively, for the ADS mode array substrate, the groove 51 is formed in a comb shape, the transparent electrode 6 can serve as the common electrode 8 which is located in the comb shape groove 51, and the array substrate further comprises a pixel electrode below the common electrode 8 via an insulating layer. Exemplarily, the pixel electrode is formed in a plate shape, and of course, the pixel electrode can also be a comb shape electrode with a slit, which is not defined herein.

In the array substrate provided by the embodiments of the present invention, the passivation layer is formed to have a groove, while the transparent electrode is formed in the groove, thus, the transparent electrode may be formed in the groove by an ashing process using a photoresist, and then a mask used to form the transparent electrode can be saved, and the production cost is lowered.

A Second Embodiment

The second embodiment of the present invention provides a manufacturing method of the array substrate of the above embodiment, as illustrated in FIG. 4, the manufacturing method comprises the following steps:

Step S1, forming a thin film transistor and a passivation layer on the substrate 1, wherein the passivation layer covers the thin film transistor.

In this step, a method known by an inventor can be used to form the thin film transistor and the passivation layer.

Detailed description will be made hereinafter with making a bottom gate type thin film transistor as an example, and the step S1 comprises: forming a gate electrode and a gate line on the substrate through a patterning process comprising depositing, exposing, developing, etching, removing and etc.; forming a gate insulating layer 2 on the substrate 1 obtained after the above steps; forming an active layer and a source/drain electrode 3 and 4 on the substrate obtained after the above steps through a patterning process, thereby forming the thin film transistor; then, forming the passivation layer 5 on the substrate with the thin film transistor formed thereon.

Alternatively, a material of forming the passivation layer is common insulating material, for example, photosensitive resin material.

It needs to be indicated that other types of thin film transistors can be formed with a method known by an inventor, which is not described herein to be simple.

Step S2, forming a groove 51 in an upper surface of the passivation layer.

Exemplarily, as illustrated in FIG. 5, the step S2 comprises:

coating a photoresist on the substrate obtained through the step S1, and exposing the photoresist through a double-tone mask (gray-tone or half-tone mask), wherein the photoresist corresponding to a region where the transparent electrode is disposed is partly exposed, the photoresist corresponding to a region of a through hole exposing the drain electrode is completely exposed, and the photoresist in the other regions is not exposed;

after a developing treatment, exposing the passivation layer in the region in which the photoresist is completely exposed, and forming the through hole exposing the drain electrode using an etching process;

removing the partly exposed photoresist by using an ashing process, that is, removing the photoresist corresponding to the region where the transparent electrode is disposed, thereby exposing the passivation layer; and partly removing the exposed passivation layer by using an etching process, thereby forming the groove 51 in the upper surface of the passivation layer, as shown in FIG. 2a.

Figure 6:
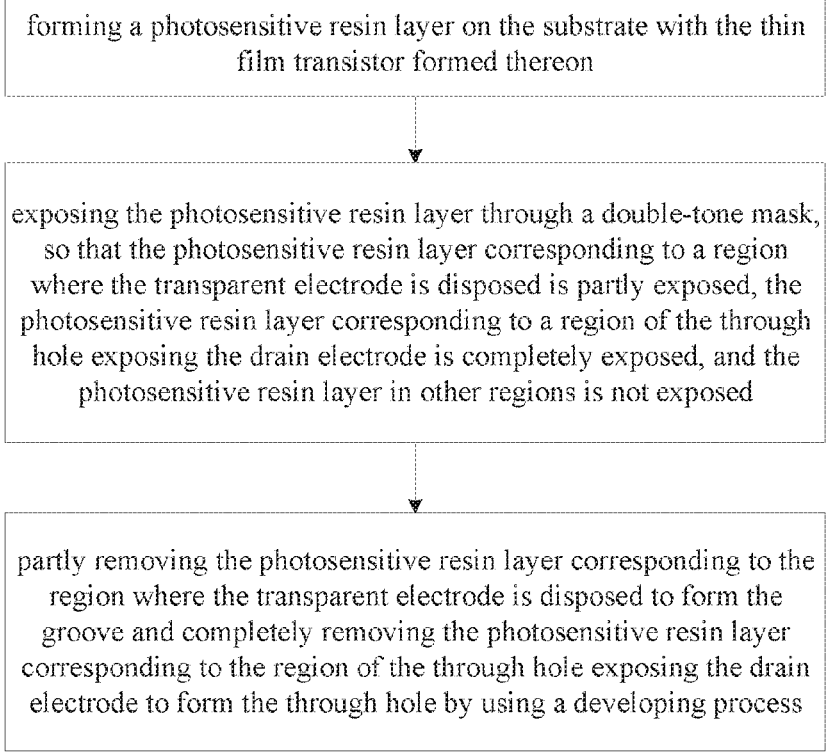

Alternatively, the following method can also be used to form the passivation layer with the groove, as illustrated in FIG. 6, step S2 comprises:

forming a photosensitive resin layer on the substrate with the thin film transistor formed thereon, and exposing the photosensitive resin layer through a double-tone mask, so that the photosensitive resin layer corresponding to a region where the transparent electrode is disposed is partly exposed, the photosensitive resin layer corresponding to a region of a through hole exposing the drain electrode is completely exposed, and the photosensitive resin layer in the other regions is not exposed; after a developing process, the photosensitive resin layer corresponding to the region where the transparent electrode is disposed is partly removed so that the groove is formed, and the photosensitive resin layer corresponding to the region of the through hole exposing the drain electrode is completely removed so that the through hole is formed.

Step S3, forming the transparent electrode in the groove 51.

Exemplarily, the step S3 comprises: forming a transparent conductive layer 16 on the substrate with the groove formed thereon; coating a photoresist 17; as the passivation layer has the groove in the upper surface, the photoresist formed in the groove and the photoresist formed out of the groove have a thickness difference, performing an ashing treatment to the photoresist according to the thickness difference to retain the photoresist in the groove and remove the photoresist in the other regions out of the groove so as to expose the transparent conductive layer; removing the exposed transparent conductive layer using an etching process, and removing the photoresist in the groove 51 to form the transparent electrode, as shown in FIGS. 2b-2e.

Alternatively, different manufacturing methods are used to produce the transparent electrode depending on different display modes of display devices.

Exemplarily, for a vertical alignment mode, the transparent electrode can serve as the pixel electrode, and the pixel electrode is connected to the thin film transistor through a through hole, for example, to the drain electrode of the thin film transistor.

Exemplarily, for a ADS mode, a common electrode is formed prior to forming the passivation layer, for example, the common electrode and the gate line are usually formed in the same patterning process, and the common electrode is formed in a plate shape, the pixel electrode is formed in the comb shape groove, and the comb shape pixel electrode is formed, and the comb shape electrode is located above the common electrode via an insulating layer therebetween. Alternatively, the transparent electrode can serve as the common electrode, and then the common electrode is formed in the comb shape groove to form a comb shape common electrode, at this moment, the pixel electrode is formed prior to forming the passivation layer, and the pixel electrode is located below the common electrode and formed in a plate shape.

Besides the above, an IPS mode display device can be made, that is, a comb shape pixel electrode and a comb shape common electrode are made, as long as each pixel electrode and each common electrode alternate with each other.

The array substrate produced with the manufacturing method of the array substrate in the above embodiment is shown in FIG. 2e or 3, compared with the prior art, as the transparent electrode is made without a mask, one mask process is saved, and then the number of a production procedure is reduced and the production cost is saved.

A Third Embodiment

The third embodiment of the present invention further provides a display device comprising the array substrate according to the above embodiments.

One example of the display device is a liquid crystal display device, wherein an array substrate and an opposite substrate are disposed to face each other to form a liquid crystal cell, and liquid crystal material is filled in the liquid crystal cell. The opposite substrate is a color filter substrate, for example. The pixel electrode of each pixel unit of the array substrate is used to apply an electric field, so as to control a rotation of the liquid crystal material and to perform a displaying operation. In some examples, the liquid crystal display device further comprises a backlight source provided for the array substrate.

Another example of the display device is an organic light emitting display device, wherein a pixel electrode of each pixel unit of the array substrate is used as an anode or a cathode to drive an organic light-emitting material to emit light so as to perform a displaying operation.

For the array substrate and the manufacturing method thereof and the display device provided by the embodiments of the present invention, the manufacturing process is simplfied by using a passivation layer with a groove, a transparent electrode is formed in the groove through an ashing process using a photoresist, thus a mask for forming the transparent electrode is saved, and the production cost can be lowered.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A manufacturing method of an array substrate, comprising:
   forming a thin film transistor and a passivation layer on a substrate, and the passivation layer covering the thin film transistor and being formed with a groove in a upper surface; and
   forming a transparent electrode in the groove;
   wherein the step of forming the groove in the upper surface of the passivation layer comprises:
   forming the passivation layer on the substrate with the thin film transistor formed thereon;
   coating a photoresist on the passivation layer, and exposing the photoresist through a double-tone mask, wherein the photoresist corresponding to a region where the transparent electrode is disposed is partly exposed, the photoresist corresponding to a region of a through hole exposing the drain electrode is completely exposed, and the photoresist in other regions is not exposed;
   after a developing treatment, removing the completely exposed photoresist so that the passivation layer corresponding to the region of the through hole exposing the drain electrode is exposed, and then forming the through hole exposing the drain electrode by using an etching process;
   removing the partly exposed photoresist by using an ashing process so that the passivation layer corresponding to the region of where the transparent electrode is disposed; and
   partly removing the exposed passivation layer by using an etching process, so that the groove is formed in an upper surface of the passivation layer.

2. The manufacturing method of the array substrate according to claim 1, wherein the forming the thin film transistor on the substrate comprises:
   forming a gate electrode on the substrate through a patterning process;
   forming a gate insulating layer on the gate electrode; and
   forming an active layer and a source/drain electrode on the gate insulating layer through a patterning process.

3. The manufacturing method of an array substrate according to claim 1, wherein the forming the transparent electrode in the groove comprises:
   forming a transparent conductive layer on the substrate with the groove formed therein;
   coating a photoresist on the transparent conductive layer;
   performing an ashing treatment to the photoresist to retain the photoresist in the groove and remove the photoresist in regions other than the groove so as to expose the transparent conductive layer; and
   removing the exposed transparent conductive layer and stripping the photoresist in the groove using an etching process, thereby forming the transparent electrode.

4. The manufacturing method of an array substrate according to claim 1, wherein the transparent electrode serves as a pixel electrode.

5. The manufacturing method of an array substrate according to claim 1, wherein the groove is formed in a comb shape, and the transparent electrode serves as a pixel electrode, before forming the passivation layer, the method further comprises: forming a common electrode.

6. The manufacturing method of an array substrate according to claim 1, wherein the groove is formed in a comb shape, and the transparent electrode serves as a common electrode, before forming the passivation layer, the method further comprises: forming a pixel electrode.

7. A manufacturing method of an array substrate, comprising:
   forming a thin film transistor and a passivation layer on a substrate, and the passivation layer covering the thin film transistor and being formed with a groove in a upper surface; and
   forming a transparent electrode in the groove;
   wherein the step of forming the groove in the upper surface of the passivation layer comprises:
   forming a photosensitive resin layer on the substrate with the thin film transistor formed thereon;
   exposing the photosensitive resin layer through a double-tone mask, so that the photosensitive resin layer corresponding to a region where the transparent electrode is disposed is partly exposed, the photosensitive resin layer corresponding to a region of the through hole exposing the drain electrode is completely exposed, and the photosensitive resin layer in other regions is not exposed;
   partly removing the photosensitive resin layer corresponding to the region where the transparent electrode is disposed to form the groove and completely removing the photosensitive resin layer corresponding to the region of the through hole exposing the drain electrode to form the through hole by using a developing process.

* * * * *